United States Patent
Cromarty et al.

(10) Patent No.: US 7,120,034 B2
(45) Date of Patent: Oct. 10, 2006

(54) METHOD AND APPARATUS FOR REDUCING ELECTROMAGNETIC RADIATION

(75) Inventors: Brian Jonathan Cromarty, Yardley, PA (US); Lawrence Charles Coan, Indianapolis, IN (US); Edward Allen Hall, Fort Wayne, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 353 days.

(21) Appl. No.: 10/476,480

(22) PCT Filed: May 2, 2002

(86) PCT No.: PCT/US02/14046

§ 371 (c)(1),
(2), (4) Date: Oct. 31, 2003

(87) PCT Pub. No.: WO02/091571

PCT Pub. Date: Nov. 14, 2002

(65) Prior Publication Data

US 2004/0155721 A1    Aug. 12, 2004

Related U.S. Application Data

(60) Provisional application No. 60/288,579, filed on May 3, 2001.

(51) Int. Cl.
*H05K 9/00* (2006.01)
(52) U.S. Cl. ..................... 361/818; 361/780
(58) Field of Classification Search ................ 361/818, 361/780
See application file for complete search history.

(56) References Cited

U.S. PATENT DOCUMENTS

| | | | |
|---|---|---|---|
| 4,495,546 A | 1/1985 | Nakamura et al. | 361/398 |
| 4,622,527 A | 11/1986 | Carlson | 333/182 |
| 4,942,380 A | 7/1990 | Bradford et al. | 335/301 |
| 5,165,055 A | 11/1992 | Metsler | 333/12 |
| 5,504,659 A * | 4/1996 | Acatay et al. | 361/816 |
| 5,539,149 A | 7/1996 | Gatti | 174/35 |
| 5,629,839 A | 5/1997 | Woychik | 361/803 |
| 5,668,701 A | 9/1997 | Fukai | 361/816 |
| 5,680,297 A | 10/1997 | Price et al. | 361/818 |
| 5,905,635 A | 5/1999 | Drevon et al. | 361/704 |
| 6,047,172 A | 4/2000 | Babineau et al. | 455/300 |
| 6,191,954 B1 | 2/2001 | Keidl et al. | 361/803 |
| 6,236,574 B1 | 5/2001 | Han | 361/816 |
| 6,246,016 B1 | 6/2001 | Roessler et al. | 174/261 |
| 6,330,167 B1 | 12/2001 | Kobayashi | 361/818 |
| 6,332,004 B1 | 12/2001 | Chan | 375/257 |
| 6,366,473 B1 | 4/2002 | Sauer | 361/818 |

FOREIGN PATENT DOCUMENTS

WO    98/33242    7/1998

OTHER PUBLICATIONS

Rudolf F. Graf, Modern Dictionary of Electronics, 7th edition.*
Copy of search report dated Aug. 8, 2002.

* cited by examiner

*Primary Examiner*—Kamand Cuneo
*Assistant Examiner*—Ivan Carpio
(74) *Attorney, Agent, or Firm*—Joseph J. Laks; Robert D. Shedd; Reitseng Lin

(57) ABSTRACT

A method for reducing electromagnetic radiation between devices in electrical communication, including processing signals within a first device in a manner tending to reduce EMR, and electromagnetically isolating the processed signals prior to communicating the signals to a subsequent device.

20 Claims, 3 Drawing Sheets

METHOD AND APPARATUS FOR REDUCING ELECTROMAGNETIC RADIATION

This application claims the benefit, under 35 U.S.C. § 365 of International Application PCT/US02/14046, filed May 2, 2002, which was published in accordance with PCT Article 21(2) on Nov. 14, 2002 in English and which claims the benefit of U.S. Provisional patent application No. 60/288,579, filed May 3, 2001.

FIELD OF THE INVENTION

This invention relates to the field of printed circuit boards (PCB) and, more specifically, to the suppression of electromagnetic radiation.

BACKGROUND OF THE INVENTION

Electromagnetic radiation (EMR) is emitted by every operating electric and/or electronic device. The power of EMR emission varies depending on the size and electrical strength of the device and the electrical current it carries or employs. In addition, unwanted currents on input and output cables to and from an electronic device may cause the cables themselves to become sources of undesirable EMR. EMR is problematic since it may interfere with components of electronic devices located in the vicinity of the source of EMR, causing electromagnetic interference (EMI). It is known that electronic components or products and devices in the vicinity of EMR sources may malfunction if subjected to certain levels of EMI. EMI generated and received by electronic devices must be attenuated not only to keep the devices functioning properly but also to bring the devices into compliance with applicable governmental regulations. In the United States, the Federal Communications Commission (FCC) promulgates regulations to limit the amount of radiation emitted from electronic equipment, and to provide for routine testing of manufactured products to ensure compliance. Similar administrative bodies perform the same function in Canada, Europe and other parts of the world.

One known solution used to contain or reduce unwanted EMR from products containing electronic devices is through the use of shielded cables. Unfortunately, shielded cables are expensive compared to unshielded cables. Shielded cables also contain a larger form factor, thus occupying much more space within a product enclosure. In addition, the integrity of shielded cables can be more easily compromised as the cables are flexed or moved because they are not as flexible as unshielded cables and the use of unshielded cables facilitates ease in manufacturing.

Another solution to contain or reduce unwanted EMR from products containing electronic devices is to place the equipment in encompassing metal enclosures. The encompassing conductive enclosure forms a Faraday shield which reduces radiated power by forcing the electric field component of an electromagnetic wave to be nearly zero at the surface of the conductor, thereby blocking wave propagation. Unfortunately, emissions through necessary openings in the enclosures for outputting signals, lessens the effectiveness of the enclosures. Additionally, the resulting package is bulky and relatively expensive.

SUMMARY OF THE INVENTION

The invention comprises a method and apparatus for reducing electromagnetic radiation (EMR) in electric and/or electronic devices.

A method according to one embodiment of the invention for reducing EMR between devices in electrical communication, includes processing signals within a first device in a manner tending to reduce EMR, and electromagnetically isolating the processed signals prior to communicating the signals to a subsequent device. The processing of this method can be accomplished by propagating the signals through a twisted pair.

In another embodiment of the present invention, a printed circuit board (PCB) for reducing EMR in signals from an electric circuit, the PCB having an input section and an output section, includes at least one input connector, mounted to the input section of the PCB, for coupling the signals to the PCB, at least one processing element, mounted to the input section of the PCB, for processing the coupled signals in a manner tending to reduce EMR, a shield wall, mounted to the PCB at the output of the at least one processing element, for electromagnetically isolating the input section of the PCB from the output section of the PCB, the shield wall having minimized apertures for passing the signals to the output section, and at least one output connector, mounted to the output section of the PCB, for outputting the processed signals.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The present invention will be described within the context of circuitry such as television circuitry and associated devices. However, it will be appreciated by those skilled in the art that the subject invention may be advantageously employed in any circuitry in which it is desired for electromagnetic radiation to be reduced. Thus, it is contemplated by the inventors, that the subject invention has broad applicability beyond the television circuitry described herein. The invention may be used to provide a means for reducing electromagnetic radiation between various electric and/or electronic devices or between circuitry of electrical or electronic systems and the like.

Figure 1:
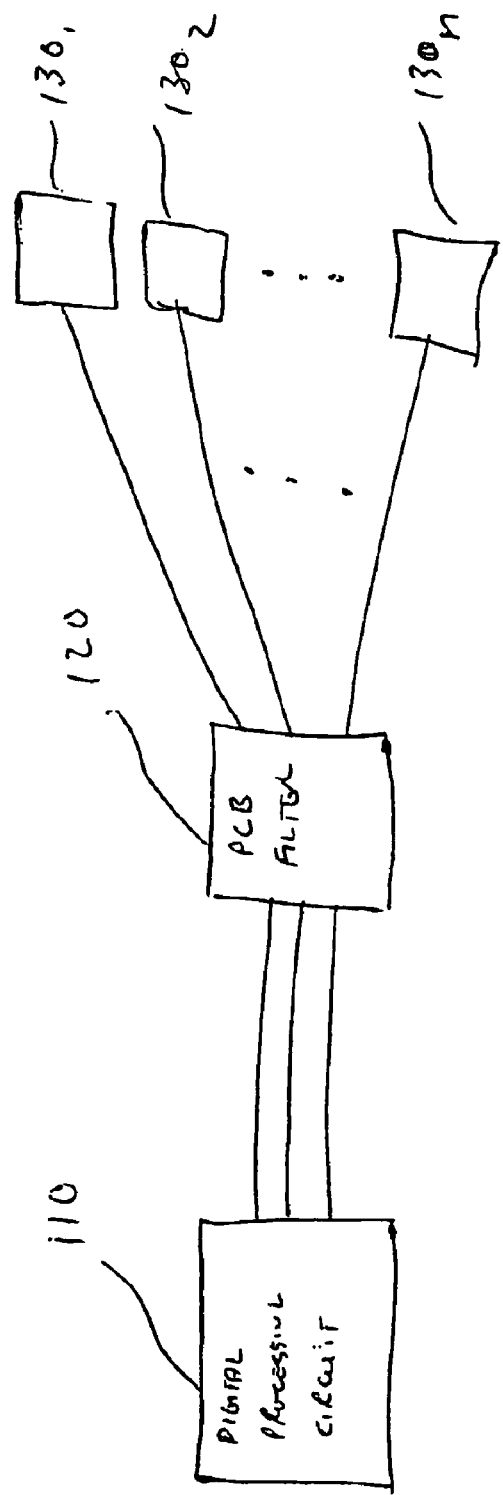
FIG. 1 depicts a high-level block diagram of one embodiment of a digital circuit in a television system 100.

FIG. 1 depicts a high-level block diagram of one embodiment of a digital circuit in a system 100. The digital circuit of the system 100 of FIG. 1 includes a digital processing circuit 110 for processing signals to be utilized as inputs for a plurality of output devices of the system, a printed circuit board (PCB) filter 120 for reducing electromagnetic radiation (EMR) in the signals processed by the digital processing circuit 110, and a plurality of output devices $130_1$–$130_n$ (collectively 130), such as display devices, audio devices, or other forms of outputs, for receiving the signals processed by the digital processing circuit 110 and filtered by the PCB filter 120. Although the PCB filter 120 in the system 100 of FIG. 1 is depicted as a separate PCB located after the digital processing circuit 110, the PCB filter 120 may be advantageously configured in various formats. For example, the PCB filter circuitry may be incorporated on a circuit board of a digital processing circuit, or on a circuit board of an output device itself. Additionally, although only one digital processing circuit 110 and one PCB filter 120 are depicted in FIG. 1, the system 100 may comprise multiple digital processing circuits and multiple PCB filters.

Figure 2:
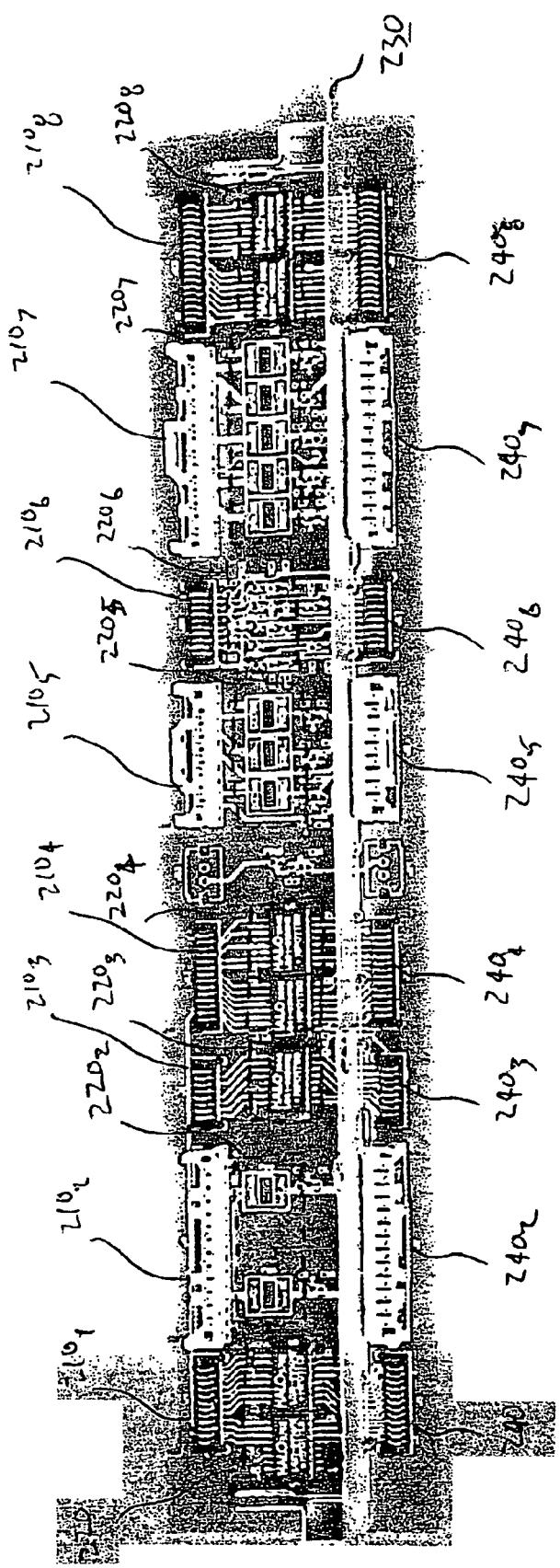
FIG. 2 depicts a top view of an embodiment of a printed circuit board filter suitable for use in the system of FIG. 1.

FIG. 2 depicts a top view of an embodiment of a PCB filter suitable for use in the system of FIG. 1. The PCB filter 120 is divided into an input section and an output section by a shield wall 230 mounted to the PCB filter 120. The input section of the PCB filter 120 of FIG. 2 includes illustratively eight input connectors $210_1$–$210_8$, and eight RF suppressing networks (illustratively networks of adjustable filters) $220_1$–$220_8$. Although adjustable filters are depicted in the input section of the PCB filter 120 of system 100 for reducing the levels of EMR in the signals from the digital processing circuit 110, other sources of RF suppression can be employed to reduce the EMR in the input section of the PCB filter 120 in accordance with the present invention, including the use of twisted pairs and other RF suppression methods known to those skilled in the art.

The output section of the PCB filter 120 includes eight output connectors $240_1$–$240_8$. Again, although the PCB filter 120 is being described within the context of the television system 100 of FIG. 1, it will be appreciated by those skilled in the art that the subject invention may be advantageously employed in any circuitry in which it is desired for electromagnetic radiation to be reduced. The number of input connectors, filter networks, and output connectors will depend on the circuitry in which the PCB filter is being implemented.

The eight input connectors $210_1$–$210_8$ in the input section of the PCB filter 120 in FIG. 2 are coupled to I/O leads and power lines from the digital processing circuit 110 by unshielded cables. The eight input connectors $210_1$–$210_8$ are each designed to mechanically couple to a respective connector of the I/O lead or power line from the digital processing circuit 110 to be connected thereby to the corresponding input connector of the PCB filter 120. Each of the eight input connectors $210_1$–$210_8$ has a corresponding output connector in the output section of the PCB filter for coupling of the signals to the output devices.

The eight filter networks $220_1$–$220_8$ in the input section of the PCB filter 120 in FIG. 2 correspond to the eight input connectors $210_1$–$210_8$ of the PCB filter 120 (that is a specific filter network is implemented for each input). Each filter network is configured such that the filters are specifically chosen to filter the type of signal from the digital processing circuit 110, input into the PCB filter 120 by each of the eight input connectors $210_1$–$210_8$. For example in the system 100 of FIG. 1, input connector $210_1$ receives a video signal from the digital processing circuit 110. The video signal's frequency ranges from 0 MHz (DC) to 5 MHz. Low pass filters with a cut-off just above 5 MHz are then used in the filter network $220_1$ to reduce the EMR in the video signal from the digital processing circuit 110 coupled to the input connector $210_1$. Although the eight filter networks $220_1$–$220_8$ may vary with respect to the type of filters used, the utility of the filter networks are the same. First differential mode filters are placed between the signal and return of each pair of lines from the incoming cables. These filters can be adjusted to be low-pass, high-pass, or band-pass filters of any number of poles required. This eliminates unwanted differential mode currents by passing them to the ground of the PCB filter 120. The second stage of filtering is used to reduce common mode currents. Typically a common mode transformer is used to reduce common mode currents, but common mode currents can also be reduced by creating a common mode filter using discrete components as in the present embodiment. The reduction in differential and common mode currents results in a reduction of EMR in the system 100. In alternate embodiments of the PCB filter 120, either the differential mode filters or the common mode filters can be eliminated if they are not required to bring the circuits of the system into compliance with applicable governmental regulations.

The shield wall 230 is positioned to electromagnetically isolate the input section of the PCB filter 120 from the output section. The shield wall 230 is soldered directly at the output of the filter networks in the input section of the PCB filter 120. It is important that the shield wall 230 be as close to the outputs of the RF suppression network, in this case the filter network, as possible so that the signals are electromagnetically shielded from the output section of the PCB filter 120 in a manner reducing the susceptibility of the processed signal to EMR. Additionally, it is necessary to couple the signals from the input section of the PCB filter 120 to the output section in a manner limiting the RF signal passed from the input section of the PCB filter to the output section. To accomplish this, the signals from the input section of the PCB filter 120 (e.g. power, filter network outputs, and the like) are coupled to the output section of the PCB filter 120 through small apertures in the shield wall 230. Because shielding is rendered less effective by holes or slots in the surface of the shield wall 230, the apertures in the shield wall 230 are minimized. The apertures in the shield wall 230 are made just large enough for the traces from the filter networks to pass to the output section and couple to the output connectors of the PCB filter 120. Furthermore, the shield wall 230 can be advantageously composed of materials of varying conductivity depending on the quantity of EMR reduction required in the system. For example a copper shield may be implemented which is a more effective means of electromagnetic isolation than a steel or aluminum shield.

The eight output connectors $240_1$–$240_8$ in the output section of the PCB filter 120 in FIG. 2 are coupled to a corresponding output of one of the eight filter networks $220_1$–$220_8$ of the input section which in turn each correspond to a specific one of the input connectors $210_1$–$210_8$. For example the processed video signal from the digital processing circuit 110 coupled to the input connector $210_1$ in the example explained above, is output on output connector $240_1$ which is designed to mechanically couple to a video output device. The eight output connectors $240_1$–$240_8$ are each individually designed to mechanically couple to the connector of an output device to be connected to the corresponding output connector of the PCB filter 120. Some output devices include a monitor, a tuner, and other output devices for the signals processed by the digital processing circuit 110. The use of the PCB filter 120 in accordance with the present invention advantageously allows for the use of unshielded cables to interconnect the various components of an electronic system, thus reducing the cost and overall size of the system.

Figure 3:
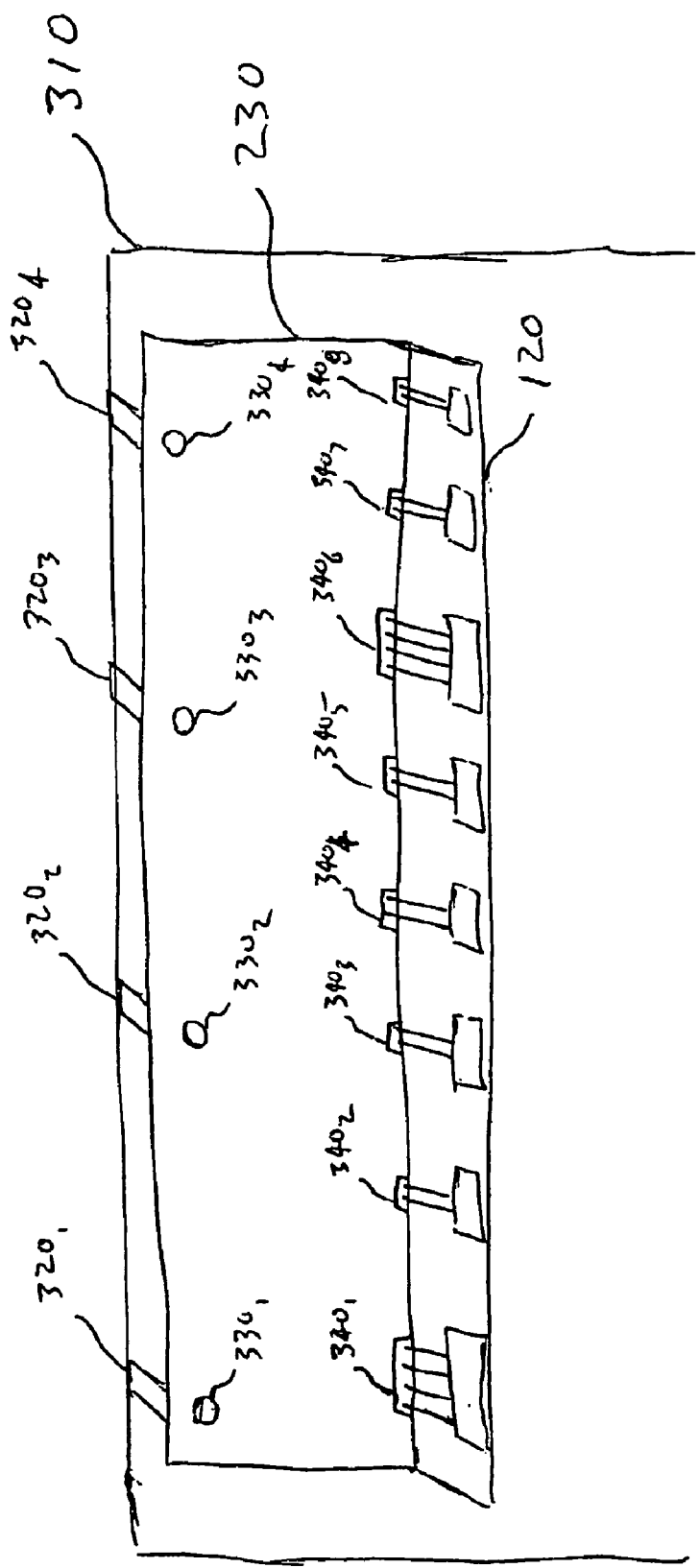
FIG. 3 depicts a front view of an embodiment for a shield wall suitable for use in the printed circuit board filter of FIG. 2.

FIG. 3 depicts a front view of an embodiment for a shield wall suitable for use in the printed circuit board filter of FIG. 2. As previously noted, the shield wall 230 is soldered to the PCB filter 120 at a point directly at the output of the common mode filters. The shield wall 230 extends upward from the board and is substantially coextensive with the length of the PCB filter 120. The minimized apertures 340$_1$–340$_8$ (collectively 340) previously described for coupling the signal from the input section of the PCB filter 120 to the output section of the PCB filter 120 are depicted in FIG. 3.

In an embodiment of the present invention, the PCB filter 120 is attached to a shielded product enclosure 310 of the system 100 of FIG. 1 by attaching the shield wall 230 to standoffs 320$_1$, 320$_2$, 320$_3$, and 320$_3$ (collectively 320) attached to the shielded product enclosure 310 through attachment holes 330$_1$, 330$_2$, 330$_3$, and 330$_3$ (collectively 330) provided in the shield wall 230. Preferably, the shielded product enclosure 310 of the system 100 should be an encompassing conductive enclosure. The encompassing conductive enclosure forms a Faraday shield which reduces radiated power by forcing the electric field component of an electromagnetic wave to be nearly zero at the surface of the conductor, thereby blocking wave propagation. The number of attachment holes 330 and subsequently the number of standoffs 320 needed to secure a PCB filter to a product enclosure depends on the size of the PCB filter being implemented in a system. The size of the PCB filter depends on the number of inputs to the PCB filter and subsequently, the number of input and output connectors required on the PCB filter. There must be adequate support for the PCB filter to prevent flexing of the PCB filter, which would result in damage. When mounting a PCB filter to a product enclosure, there also must be electrical conductivity between the PCB filter, the standoffs, and the product enclosure to minimize electromagnetic wave propagation. The mounted PCB filter 120 provides for a means to input to or output the signals from an electric and/or electronic circuit, while maintaining the integrity of the product enclosure for reducing EMR. By implementing the PCB filter 120, unshielded cables can be used to transfer data to and from an electronic circuit.

In another embodiment of the present invention, a PCB filter in accordance with the present invention is used to reduce the EMR of signals transmitted to an electric and/or electronic circuit in the same manner described above. Additionally, another PCB filter in accordance with the present invention is used to reduce the EMR of the signals output from the same electronic circuit. In this manner an electronic device or system can be constructed in which all of the signals to the various electronic components and all of the signals from the various electronic components are reduced in EMR via a PCB filter in accordance with the present invention.

In another embodiment of the present invention, all of the signals to the various electric and/or electronic components and all of the signals from the various electronic components of an electronic device or system are reduced in EMR by a single PCB filter comprising a plurality of input connectors and a plurality of output connectors to accommodate all of the signals from the various components.

While the forgoing is directed to some embodiments of the present invention, other and further embodiments of the invention may be devised without departing from the basic scope thereof. As such, the appropriate scope of the invention is to be determined according to the claims, which follow.

The invention claimed is:

1. A method for reducing electromagnetic radiation between devices in electrical communication, comprising the steps of:

coupling a signal from a first printed circuit board comprising a first electrical circuit and a first source of reference potential within an electromagnetically shielded enclosure to a second printed circuit board comprising a second electrical circuit, wherein said second electrical circuit comprises a second source of reference potential, a shield wall electrically connected between said second source of reference potential and said electromagnetically shielded enclosure, and a signal processing circuit coupled to said second source of reference potential;

processing said signal within said signal processing circuit in a manner tending to reduce electromagnetic interference, wherein a portion of said electromagnetic interference is conducted to said second source of reference potential; and coupling said processed signal through an aperture in said shield wall to a third electrical circuit located outside of said electromagnetically shielded enclosure.

2. The method of claim 1, wherein said coupling step for coupling said signal from said first printed circuit board to said second printed circuit board comprises coupling said signal through a twisted pair electrical cable.

3. The method of claim 1, wherein said processing step comprises reducing differential mode current in said signal.

4. The method of claim 1, wherein said processing step comprises reducing common mode current in said signal.

5. The method of claim 1, wherein said processing step comprises reducing differential mode and common mode currents in said signal.

6. The method of claim 1, wherein said coupling step for coupling said processed signal through an aperture in said shield wall comprises coupling said signal through a twisted pair electrical cable.

7. The method of claim 6 wherein said twisted pair electrical cable is an electromagnetically shielded twisted pair electrical cable.

8. The method of claim 1, wherein said third printed circuit board further comprises a third source of reference potential.

9. A printed circuit board for reducing electromagnetic interference, said printed circuit board having an input section and an output section and further comprising:

a first point of reference potential;

an input connector mounted to the input section of the printed circuit board, for coupling a signal from a signal source having a second point of reference potential to the printed circuit board;

a processing element mounted to the input section of the printed circuit board, for processing said signal wherein said processing element is electrically coupled to said first point of reference potential;

a shield wall, electrically coupled to said first point of reference potential, mounted between said input section and said output section of said printed circuit board and proximate to an output of said processing element, for electromagnetically isolating the input section of the printed circuit board from the output section of the printed circuit board, said shield wall having minimized apertures for passing said signals to the output section; and at least one output connector, mounted to the output section of the printed circuit board, for outputting the processed signal to a electrical circuit included in a different printed circuit board having a third point of reference potential.

10. The printed circuit board of claim 9, wherein the shield wall is comprised of copper.

11. The printed circuit board of claim 9, wherein the shield wall is comprised of metal.

12. The printed circuit board of claim 9, wherein the shield wall is comprised of aluminum.

13. The printed circuit board of claim 9, wherein the PCB filter is incorporated into the signal source.

14. The printed circuit board of claim 9, wherein the input section of the printed circuit board is located inside a product enclosure housing of said signal source, by attaching the shield wall to the product enclosure through attachment holes such that electrical communication is established between the product enclosure, the processing element, and the shield wall.

15. The printed circuit board of claim 9, wherein said shield wall is substantially planar, said signals passing through said apertures in a path substantially perpendicular to said shield wall plane.

16. The printed circuit board of claim 9, wherein said shield wall has a height parameter greater than a width parameter.

17. The printed circuit board of claim 9, wherein said shield wall comprises attachment points for securing said shield wall to a wall of a product enclosure enclosing said signal source such that the connection between said shield wall and said wall of said product enclosure reduces the transfer of radiated electromagnetic energy through said connection.

18. The printed circuit board of claim 17 wherein said first point of reference potential is electrically coupled to said second point of reference potential through said wall of said product enclosure.

19. A printed circuit board filter for reducing electromagnetic radiation in signals from an electric circuit, said printed circuit board filter having an input section and an output section, comprising:

means for coupling a signal within an electromagnetically shielded enclosure from a first printed circuit board comprising a first electrical circuit and a first source of reference potential to a second printed circuit board comprising said printed circuit board filter and a second source of reference potential;

means for processing said signal within said printed circuit board filter in a manner tending to reduce electromagnetic interference within said signal and coupling said electromagnetic interference to said second source of reference potential;

means for coupling said electromagnetic interference from said second source of reference potential to said electromagnetically shielded enclosure; and means for coupling said processed signal to a third electrical circuit located outside of said electromagnetically shielded enclosure.

20. The printed circuit board filer of claim 19, wherein said third printed circuit is included in a second circuit board comprising a third source of reference potential.

* * * * *